(12) United States Patent
Ahn et al.

(10) Patent No.: US 11,705,323 B2
(45) Date of Patent: Jul. 18, 2023

(54) WAFER TRIMMING DEVICE

(71) Applicant: SAMSUNG ELECTRONICS CO., LTD., Suwon-si (KR)

(72) Inventors: Jungseok Ahn, Seoul (KR); Unbyoung Kang, Hwaseong-si (KR); Chungsun Lee, Asan-si (KR); Teakhoon Lee, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 253 days.

(21) Appl. No.: 17/078,278

(22) Filed: Oct. 23, 2020

(65) Prior Publication Data

US 2021/0320000 A1 Oct. 14, 2021

(30) Foreign Application Priority Data

Apr. 9, 2020 (KR) ........................ 10-2020-0043250

(51) Int. Cl.
| | |
|---|---|
| *H01L 21/02* | (2006.01) |
| *H01L 21/304* | (2006.01) |
| *B24B 21/00* | (2006.01) |
| *B28D 5/02* | (2006.01) |
| *B26D 7/18* | (2006.01) |
| *H01L 21/68* | (2006.01) |

(52) U.S. Cl.
CPC ...... *H01L 21/02021* (2013.01); *B24B 21/002* (2013.01); *B26D 7/18* (2013.01); *B28D 5/02* (2013.01); *H01L 21/304* (2013.01); *H01L 21/68* (2013.01)

(58) Field of Classification Search
CPC . H01L 21/02021; H01L 21/304; H01L 21/68; B24B 21/002; B26D 7/18; B28D 5/02
See application file for complete search history.

(56) References Cited

U.S. PATENT DOCUMENTS

| | | |
|---|---|---|
| 6,881,130 B1 | 4/2005 | Stocker |
| 7,241,205 B2 | 7/2007 | Toyota et al. |
| 7,351,131 B2 | 4/2008 | Nakamura et al. |
| 7,727,860 B2 * | 6/2010 | Miyazaki .......... H01L 21/76256 438/459 |
| 8,426,256 B2 | 4/2013 | Hsiao et al. |
| 8,551,881 B2 | 10/2013 | Shih et al. |

(Continued)

FOREIGN PATENT DOCUMENTS

| | | |
|---|---|---|
| JP | 2003503225 A | 1/2003 |
| JP | 2005254343 A | 9/2005 |

(Continued)

*Primary Examiner* — David Vu
*Assistant Examiner* — Brandon C Fox
(74) *Attorney, Agent, or Firm* — Myers Bigel, P.A.

(57) ABSTRACT

The wafer trimming device includes a chuck table configured to hold a target wafer via suction, thereby fixing the target wafer, a notch trimmer configured to trim a notch of the target wafer, and an edge trimmer configured to trim an edge of the target wafer. The notch trimmer includes a notch trimming blade configured to rotate about a rotation axis perpendicular to a circumferential surface of the target wafer. The edge trimmer includes an edge trimming blade configured to rotate about a rotation axis parallel to the circumferential surface of the target wafer.

20 Claims, 8 Drawing Sheets

(56) References Cited

U.S. PATENT DOCUMENTS

| | | |
|---|---|---|
| 9,676,114 B2 | 6/2017 | Kuo et al. |
| 2005/0245174 A1 | 11/2005 | Toyota et al. |
| 2005/0250423 A1 | 11/2005 | Nakamura et al. |
| 2009/0042363 A1 | 2/2009 | Miyazaki et al. |
| 2009/0156104 A1* | 6/2009 | Kim ........................ B24B 9/065 |
| | | 451/178 |
| 2010/0279463 A1 | 11/2010 | Hsiao et al. |
| 2012/0270394 A1 | 10/2012 | Shih et al. |
| 2013/0220090 A1 | 8/2013 | Kuo et al. |
| 2017/0294300 A1* | 10/2017 | Kozai ............... H01L 21/67259 |
| 2020/0185241 A1* | 6/2020 | Kunitake ................ H01L 22/12 |
| 2021/0050238 A1* | 2/2021 | Yang ................ H01L 21/67092 |
| 2021/0287996 A1* | 9/2021 | Zeng ................ H01L 21/02005 |

FOREIGN PATENT DOCUMENTS

| | | | |
|---|---|---|---|
| JP | 2007175834 A | 7/2007 | |
| JP | 2008018502 A | 1/2008 | |
| JP | 4639405 B2 | 12/2010 | |
| JP | 6145548 B1 | 5/2017 | |
| JP | 2018058129 A | 4/2018 | |

* cited by examiner

WAFER TRIMMING DEVICE

CROSS-REFERENCE TO THE RELATED APPLICATION

This application claims priority from Korean Patent Application No. 10-2020-0043250, filed on Apr. 9, 2020, in the Korean Intellectual Property Office, the disclosure of which is incorporated herein by reference in its entirety.

BACKGROUND

1. Field

The exemplary embodiments of the disclosure relate to a wafer trimming device capable of preventing the formation of a crack in a notch bevel area in a back-grinding process through edge trimming and notch trimming.

2. Description of the Related Art

In a semiconductor chip with a reduced thickness, a crack may be formed in a notch bevel area that is not trimmed during a wafer back-grinding process. Conventional trimming blades may have a radius that is so large that the trimming blades may not be able to remove the bevel of a notch. When the width of edge trimming is increased so that an area including a notch can be trimmed, good die (GD) area may be reduced due to an increase in edge trim area. Furthermore, there may be a problem in that a notch may disappear from a wafer after back-grinding. Therefore, it would be desirable to prevent the formation of a crack during a back-grinding process by allowing the removal of a bevel of a notch area without reducing GD area.

SUMMARY

The exemplary embodiments of the present disclosure provide a wafer trimming device capable of removing a bevel area while preventing the formation of a crack in a back-grinding process through vertical trimming of edge and notch areas in a wafer.

In addition, the exemplary embodiments of the present disclosure provide a wafer trimming device capable of minimizing a trimming width while preventing a reduction in good die (GD) area through separate trimming of an edge and a notch.

A wafer trimming device according to an embodiment of the present disclosure may include a chuck table configured to hold a target wafer via suction, thereby fixing the target wafer, a notch trimmer configured to trim a notch of the target wafer, and an edge trimmer configured to trim an edge of the target wafer. The notch trimmer may include a notch trimming blade rotating about a rotation axis perpendicular to a circumferential surface of the target wafer. The edge trimmer may include an edge trimming blade rotating about a rotation axis parallel to the circumferential surface of the target wafer.

A wafer trimming device according to an embodiment of the present disclosure may include a chuck table configured to hold a target wafer via suction, thereby fixing the target wafer, and a bar-shaped trimmer configured to trim a notch and an edge of the target wafer. The trimmer may include a central shaft, and a trimming blade rotating about the central shaft.

A wafer trimming device according to an embodiment of the present disclosure may include a chuck table configured to hold a target wafer via suction, thereby fixing the target wafer, a notch trimmer configured to trim a notch of the target wafer, and an edge trimmer configured to trim an edge of the target wafer. The notch trimmer may include a notch trimming blade rotating about a rotation axis perpendicular to a circumferential surface of the target wafer. The edge trimmer may include an edge trimming blade rotating about a rotation axis parallel to the circumferential surface of the target wafer, The edge trimmer may include an edge trimming blade rotating about a rotation axis parallel to the circumferential surface of the target wafer, a horizontal control module, and a vertical control module. A center of the vertical control module and a center of the target wafer may be vertically aligned with each other. The edge trimmer may rotate about the center of the vertical control module as the rotation axis thereof.

In accordance with each exemplary embodiment of the present disclosure, the wafer trimming device may separately trim an edge and a notch in a wafer such that trimming cross-sections of edge and notch areas in the wafer are vertical, thereby removing a bevel area. Accordingly, it may be possible to prevent the formation of a crack during a back-grinding process. The trimming width may also be minimized and, as such, it may be possible to prevent a reduction in good die (GD) area.

DETAILED DESCRIPTION OF EXEMPLARY EMBODIMENTS

Figure 1:
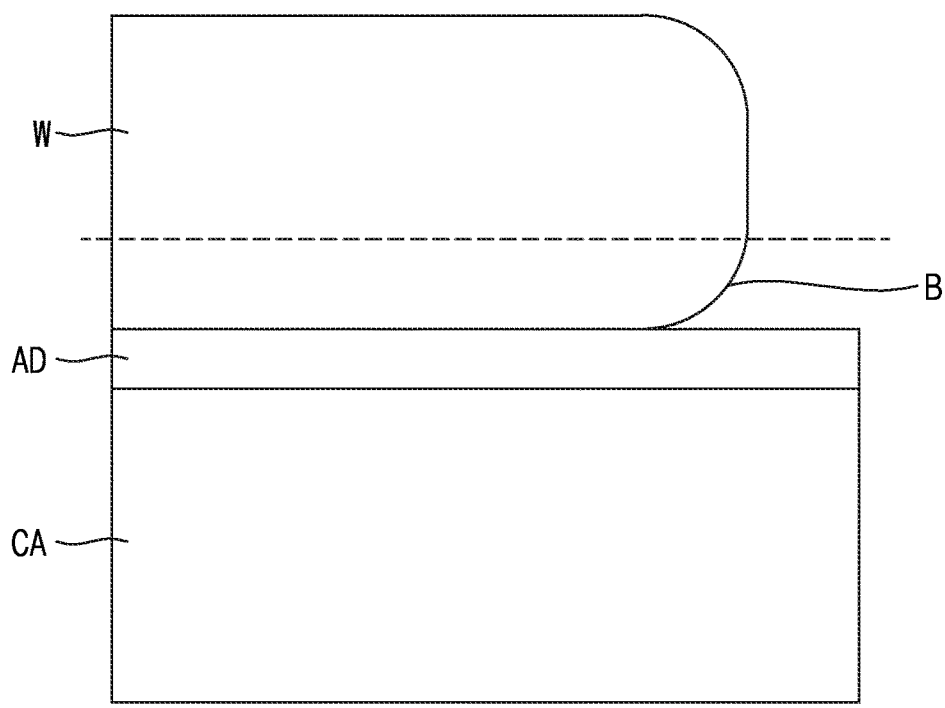
FIG. 1 is a view showing a bevel area B in the case in which edge and notch trimming is not performed or in the case in which edge and notch areas are not vertically trimmed.

FIG. 1 is a view showing a bevel area B in the case in which edge and notch trimming is not performed or in the case in which edge and notch areas are not vertically trimmed. Referring to FIG. 1, when a bevel area B is included in a wafer W at lower surfaces of an edge and a notch in the wafer W, a gap may be formed between the wafer W and a carrier wafer CA.

Figure 2:
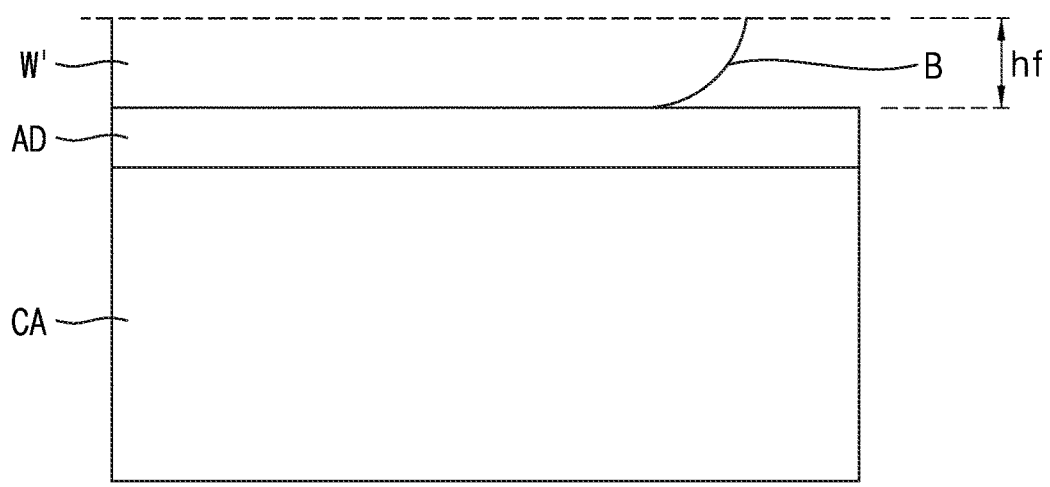
FIG. 2 is a view showing a wafer W after back-grinding, when viewed at one side, in the case in which edge and notch trimming is not performed or in the case in which edge and notch areas are not vertically trimmed.

FIG. 2 is a view showing a wafer W after back-grinding, when viewed at one side, in the case in which edge and notch trimming is not performed or in the case in which edge and notch areas are not vertically trimmed. Referring to FIG. 2, a bevel area B may be included in the wafer W even at a lower surface of the wafer W in a final state of the wafer W after back-grinding. As a final thickness hf of the wafer W decreases, the probability of a crack being formed during or after a back-grinding process may increase.

FIGS. 3, 4, 5A, 5B, and 6 are views illustrating wafer trimming devices 1, 2A, 2B, 2C, and 3 according to various embodiments of the present disclosure, respectively.

Figure 3:
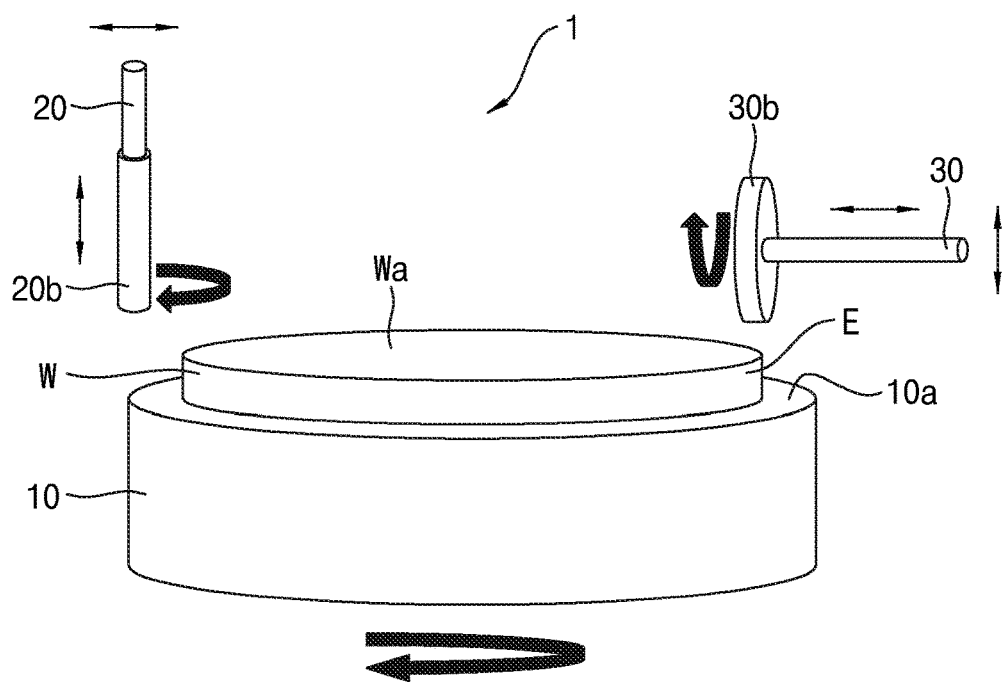
FIGS. 3, 4, 5A, 5B, and 6 are views illustrating wafer trimming devices 1, 2A, 2B, 2C, and 3 according to various embodiments of the present disclosure, respectively.

Referring to FIG. 3, the wafer trimming device 1 according to one exemplary embodiment of the present disclosure may include a chuck table 10, a notch trimmer 20, and an edge trimmer 30. The chuck table 10 may hold a target wafer W using suction to thereby fix the target wafer W. The chuck table 10 may fix the target wafer W via suction using vacuum. For example, the chuck table 10 may include suction holes/slots in fluid communication with a vacuum source. In an embodiment, the chuck table 10 may rotate. For example, in the illustrated embodiment of FIG. 3, the chuck table 10 rotates clockwise. However, in other embodiments, the chuck table 10 may rotate counterclockwise.

The notch trimmer 20 may trim a notch N of the target wafer W. Referring to FIG. 3, the notch trimmer 20 may include a notch trimming blade 20b rotating about a rotation axis perpendicular to a circumferential surface Wa of the target wafer W. Referring to FIG. 3, the notch trimming blade 20b rotates clockwise, without being limited thereto. The notch trimming blade 20b may have a bar shape. The notch trimmer 20 may be oriented so as to be perpendicular to the circumferential surface Wa of the target wafer W. The notch trimming blade 20b may have a flat lower surface. When the notch trimming blade 20b has a flat lower surface, an upper surface of the notch N may be flat after trimming of the notch N.

In an embodiment, the notch trimmer 20 may trim the notch N in a direction perpendicular to the circumferential surface Wa of the target wafer W. That is, the notch trimmer 20 may trim the notch N while pressing the target wafer W downwards from an upper surface of the target wafer W in a manner similar to that of a drill. In this case, the notch trimmer 20 may move downwards from the upper surface of the target wafer W by the height of a notch trim NT (FIG. 9) to be trimmed.

In an embodiment, the notch trimmer 20 may trim the notch N in a direction parallel to the circumferential surface Wa of the target wafer W. That is, the notch trimmer 20 may trim the notch N in a manner similar to grinding while moving from a side surface of the notch N in the target wafer W toward a center of the target wafer W. In this case, the notch trimmer 20 may move from a side surface of the target wafer W toward the center of the target wafer W in a state of being fixed at the level of a notch trim NT to be trimmed. The notch trimmer 20 may move toward the center of the target wafer W by the width of the notch trim NT to be trimmed.

In an embodiment, the notch trimmer 20 may trim the notch N in a direction parallel to the circumferential surface Wa of the target wafer W while trimming the notch N in a direction perpendicular to the circumferential direction of the target wafer W in a simultaneous manner.

In an embodiment, the lowest surface of the notch trimming blade 20b may be co-planar with the uppermost surface 10a of the chuck table 10. In this case, the notch trimming blade 20b may perform trimming such that the height of the notch trim is equal to the height of the target wafer W.

For example, in the case of a 12-inch target wafer W having a notch with a width of about 3 mm, the notch trimming blade may have a diameter of 3 mm or less.

The edge trimmer 30 may trim an edge E of the target wafer W. Referring to FIG. 3, the edge trimmer 30 may include an edge trimming blade 30b rotating about a rotation axis parallel to the circumferential surface Wa of the target wafer W. Referring to FIG. 3, the edge trimming blade 30b rotates counterclockwise, without being limited thereto. The edge trimming blade 30b may have a disk shape with a flat plate surface. When the edge trimming blade 30b has a flat plate surface, a side surface of the edge E trimmed by the flat plate surface may be flat. The edge trimmer 30 may be oriented parallel to the circumferential surface Wa of the target wafer W. That is, the edge trimming blade 30b of the edge trimmer 30 may be oriented perpendicular to the target wafer W. Referring to FIG. 3, the chuck table 10 may rotate during edge trimming in order to ensure that an edge trim ET (FIGS. 8, 9, 11) has a uniform width.

In an embodiment, the edge trimmer 30 may trim the edge E in a direction perpendicular to the circumferential surface Wa of the target wafer W. That is, the edge trimmer 30 may trim the edge E while pressing the target wafer W downwards from the upper surface of the target wafer W in a manner similar to that of a circular saw. In this case, the edge trimmer 30 may move downwards from the upper surface of the target wafer W by the height of the edge trim ET to be trimmed.

In an embodiment, the edge trimmer 30 may trim the edge E in a direction parallel to the circumferential surface Wa of the target wafer W. That is, the edge trimmer 30 may trim the edge E while moving from a side surface of the edge E in the target wafer toward the center of the target wafer W in a manner similar to grinding. In this case, the edge trimmer 30 may move from the side surface of the target wafer W toward the center of the target wafer W in a state of being fixed at the level of the edge trim ET to be trimmed. The edge trimmer 30 may move toward the center of the target wafer W by the width of the edge trim ET to be trimmed.

In an embodiment, the edge trimmer 30 may trim the edge E in a direction parallel to the circumferential surface of the target wafer W while trimming the edge E in a direction perpendicular to the circumferential direction of the target wafer W in a simultaneous manner.

In an embodiment, the edge trimming blade 30b may have a diameter greater than the height of the target wafer W. If necessary, the edge trimming blade 30b may perform trimming such that the height of the edge trim ET is equal to the height of the target wafer W.

Figure 4:
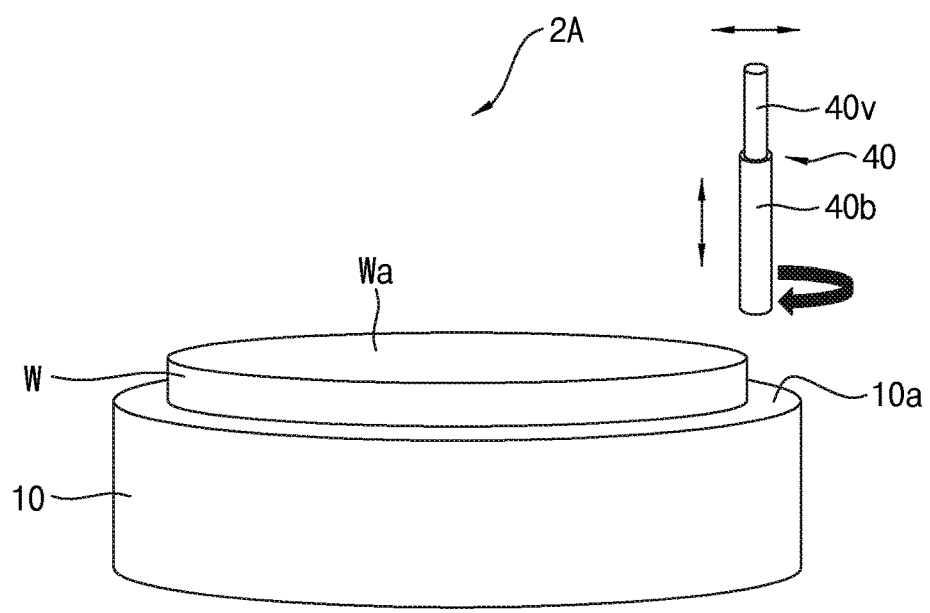
Figure 5A:
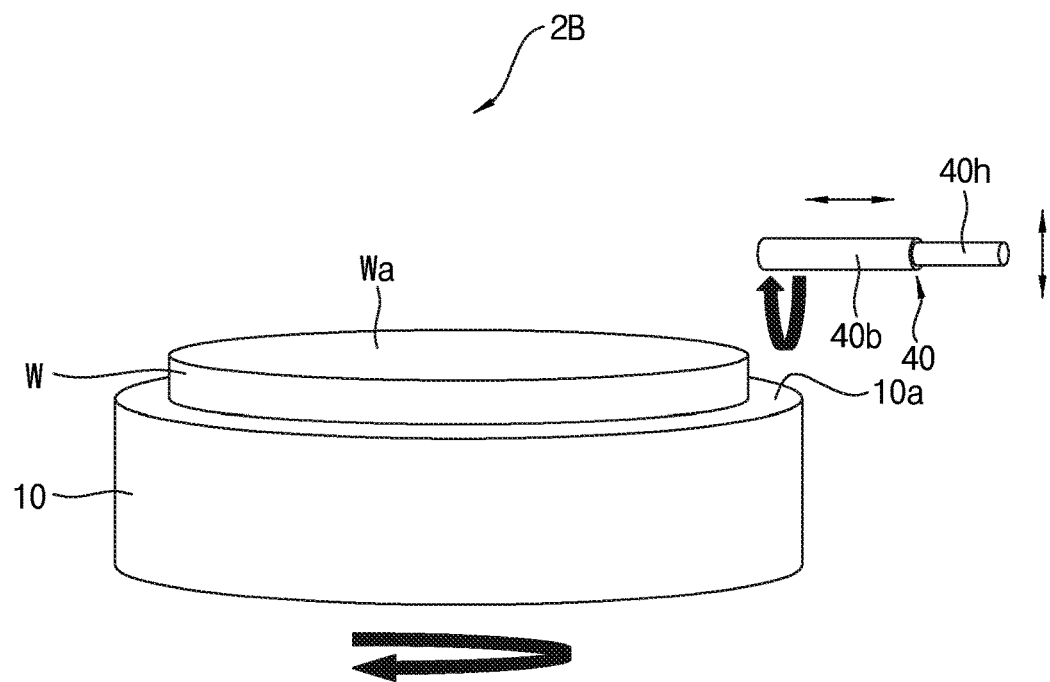
Figure 5B:
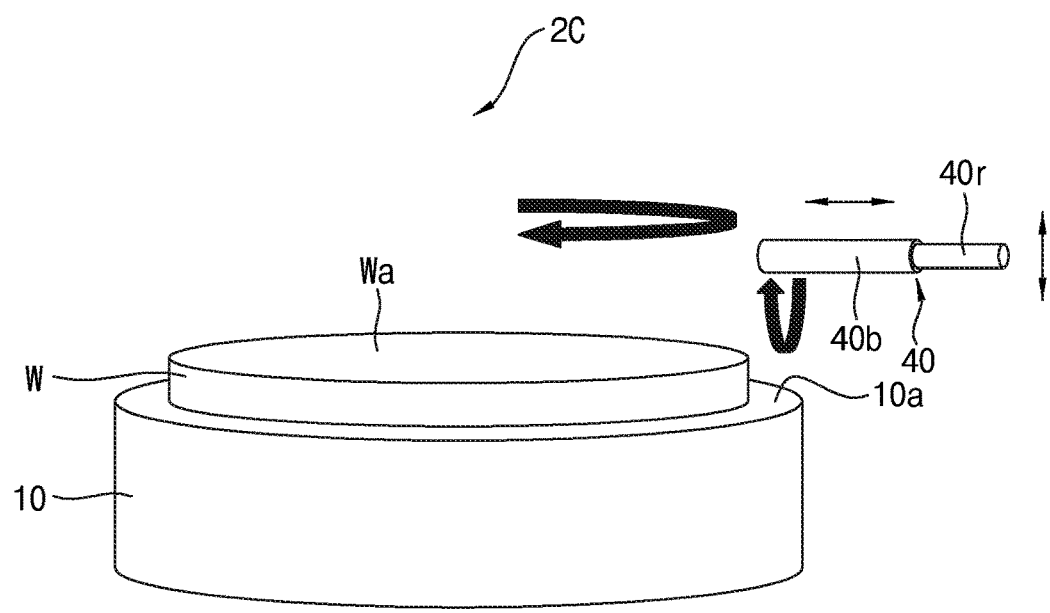

Referring to FIGS. 4, 5A, and 5B, each of the wafer trimming devices 2A, 2B, and 2C, which are collectively referred to as a "wafer trimming device 2", may include a chuck table 10 configured to hold the target wafer W via suction to fix the target wafer W, and a trimmer 40 configured to trim a notch and an edge while having a bar shape.

The trimmer 40 may trim the notch N and the edge E of the target wafer W. The trimmer 40 may include a central shaft, and a trimming blade 40b rotating about the central shaft. The trimmer 40 may have a mode-changeable structure such that the trimmer 40 may be oriented in a vertical mode 40v in which the central shaft is disposed perpendicular to the circumferential surface Wa of the target wafer W or in a horizontal mode 40h in which the central shaft is disposed in parallel to the circumferential surface Wa of the target wafer W. In other words, the trimmer 40 is movable between a vertical mode 40v and a horizontal mode 40h. Referring to FIGS. 4 and 5A, the trimmer 40 may trim the notch N in the vertical mode 40v (FIG. 4), and may trim the edge E in the horizontal mode 40h (FIG. 5A). In an embodiment, the trimmer 40 may trim the edge E in the vertical mode 40v.

Referring to FIG. 4, in the vertical mode 40v, the trimming blade 40b of the trimmer 40 may rotate about a rotation axis perpendicular to the circumferential surface of the target wafer W. Referring to FIG. 4, the trimming blade 40b rotates clockwise in the vertical mode 40v, without being limited thereto. In this case, the trimming blade 40b may have a flat lower surface. When the trimming blade 40b has a flat lower surface, the upper surface of the notch trim NT (FIG. 9) or the upper surface of the edge trim ET (FIG. 9) may be flat.

Referring to FIG. 5A, in the horizontal mode 40h, the trimming blade 40b of the trimmer 40 may rotate about a rotation axis parallel to the circumferential surface of the target wafer W. Referring to 5A, the trimming blade 40b rotates counterclockwise in the horizontal mode 40h, without being limited thereto. In the horizontal mode 40h, the trimming blade 40b may have a flat side surface. When the trimming blade 40b has a flat side surface, the side surface of the etch trim ET may be flat.

The trimmer 40 may trim the edge in a direction perpendicular or parallel to the circumferential surface of the wafer W in the vertical mode 40v or in the horizontal mode 40h. During edge trimming, the chuck table 10 may rotate in order to ensure that the edge trim ET has a uniform width.

In the vertical mode 40v, the trimmer 40 may trim the notch N in a direction perpendicular or parallel to the circumferential surface of the target wafer W. The notch N is disposed at a portion of the target wafer W and, as such, the chuck table 10 may not rotate during notch trimming. For vertical trimming of a notch area, it is preferred that the trimmer 40 be oriented in the vertical mode 40v during notch trimming.

Referring to FIG. 5B, the trimmer 40 may have a rotation mode 40r in which the trimmer 40 rotates about an axis that is parallel to the target wafer W in a state in which the central shaft thereof is oriented parallel to the circumferential surface Wa of the target wafer W. In an embodiment, in place of rotation of the chuck table 10, the trimmer 40 may directly move and rotate to trim the edge of the target wafer W. In an embodiment, the trimmer 40 may rotate about an axis that is parallel to the target wafer W in a state in which the central shaft thereof is arranged perpendicular to the circumferential surface Wa of the target wafer W.

Figure 6:
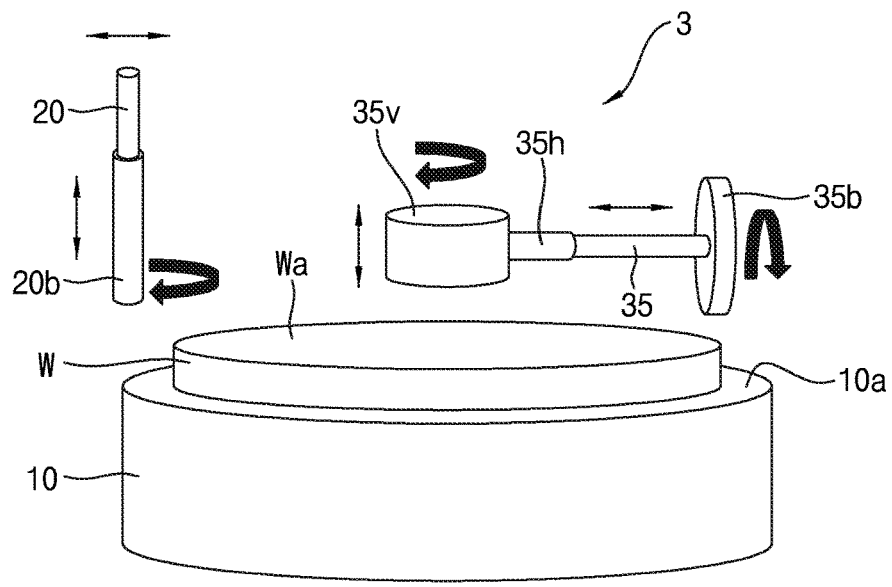

Referring to FIG. 6, the wafer trimming device 3 according to an exemplary embodiment of the present disclosure may include a chuck table 10 configured to hold a target wafer W via suction in order to fix the target wafer W, a notch trimmer 20 configured to trim a notch of the target wafer W, and a rotary edge trimmer 35 configured to trim an edge of the target wafer W. Referring to FIG. 6, the notch trimmer 20 may include a bar-shaped notch trimming blade 20b configured to rotate about a rotation axis perpendicular to a circumferential surface Wa of the target wafer W. The notch trimmer 20 may be oriented perpendicular to the circumferential surface Wa of the target wafer W.

The rotary edge trimmer 35 may include an edge trimming blade 35b configured to rotate about a rotation axis that is parallel to the circumferential surface Wa of the target wafer W, a horizontal control module 35h configured to adjust a horizontal position of the edge trimming blade 35b, and a vertical control module 35v configured to adjust a vertical position of the edge trimming blade 35b. The center of the vertical control module 35v may be vertically aligned with the center of the target wafer W. The rotary edge trimmer 35 may rotate about the center of the vertical control module 35v as a rotation axis thereof. In an embodiment, in place of rotation of the chuck table 10, the rotary edge trimmer 35 may directly move and rotate to trim the edge of the target wafer W.

Figure 7:
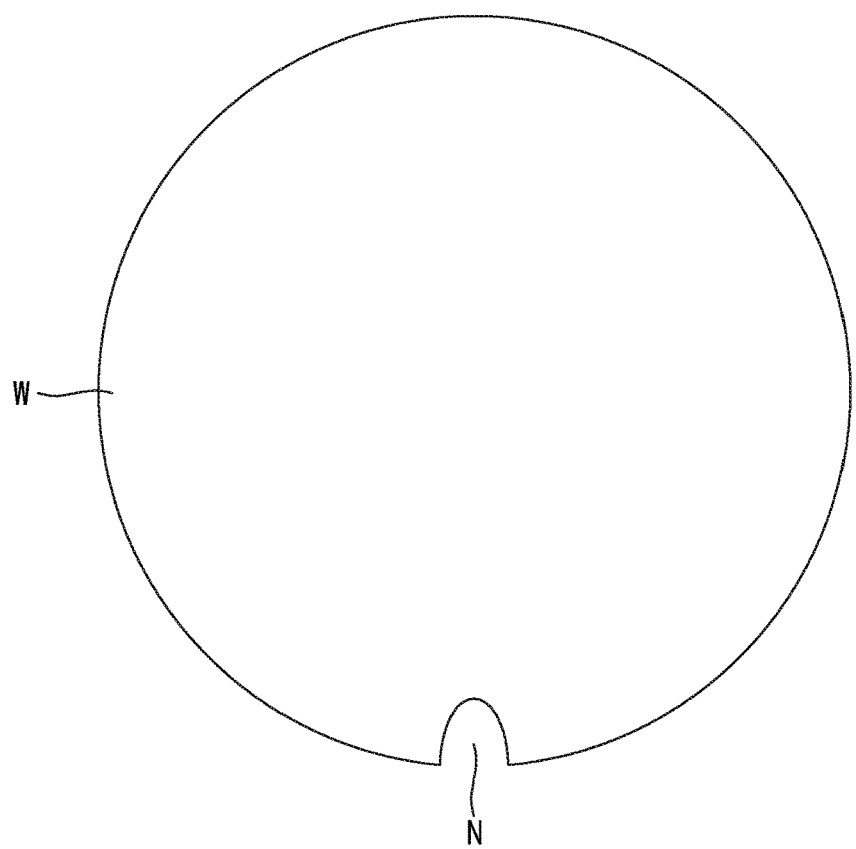
FIGS. 7, 8, 9, and 10 are views illustrating wafer trimming procedures using the wafer trimming devices 1, 2, and 3, respectively.

FIGS. 7, 8, 9, and 10 are views illustrating wafer trimming procedures using the wafer trimming devices 1, 2, and 3, respectively. Referring to FIG. 7, the target wafer W may include a notch N. For example, the target wafer W may be a 12-inch wafer.

Figure 8:
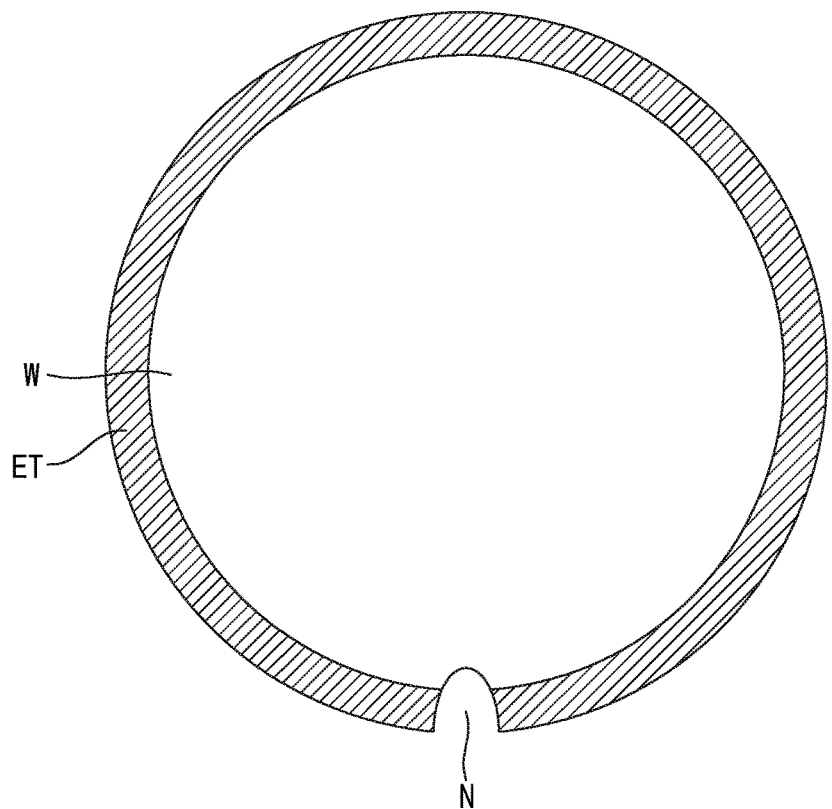
Figure 9:
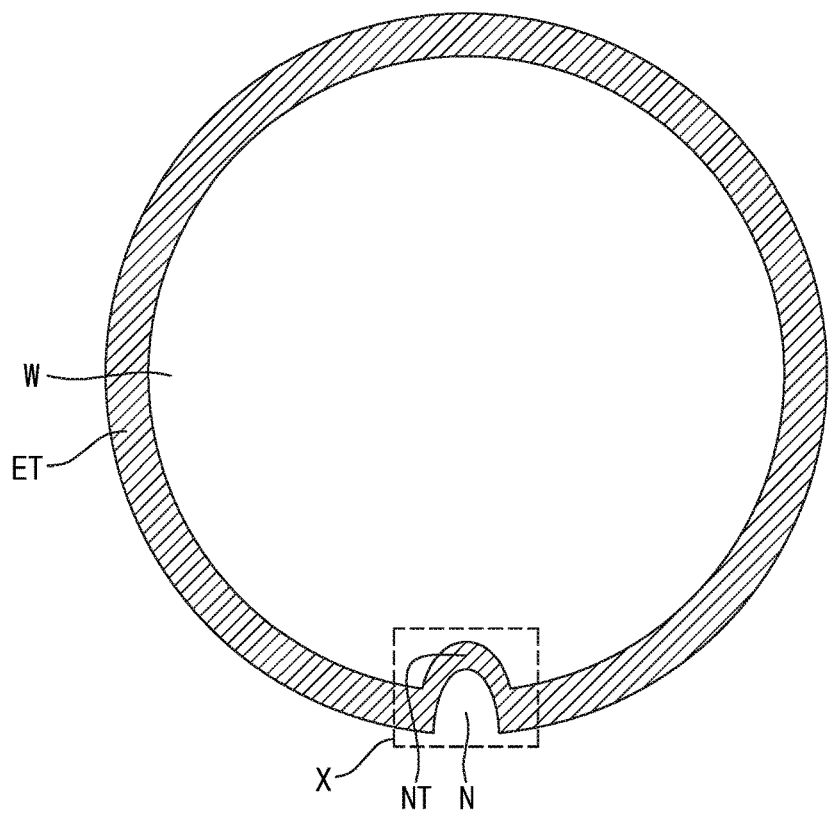

Referring to FIGS. 8 and 9, the target wafer W may include an etch trim ET and a notch trim NT (FIG. 9). The etch trim ET may be included in a circumferential edge of the target wafer W. The edge trim ET may be formed as the edge of the target wafer W is recessed downwards. The notch trim NT may be formed as a portion of the notch N of the target wafer W is recessed downwards and toward the center of the target wafer W. In an embodiment, the depth of the notch trim NT and the depth of the edge trim ET may differ from each other.

Figure 10:
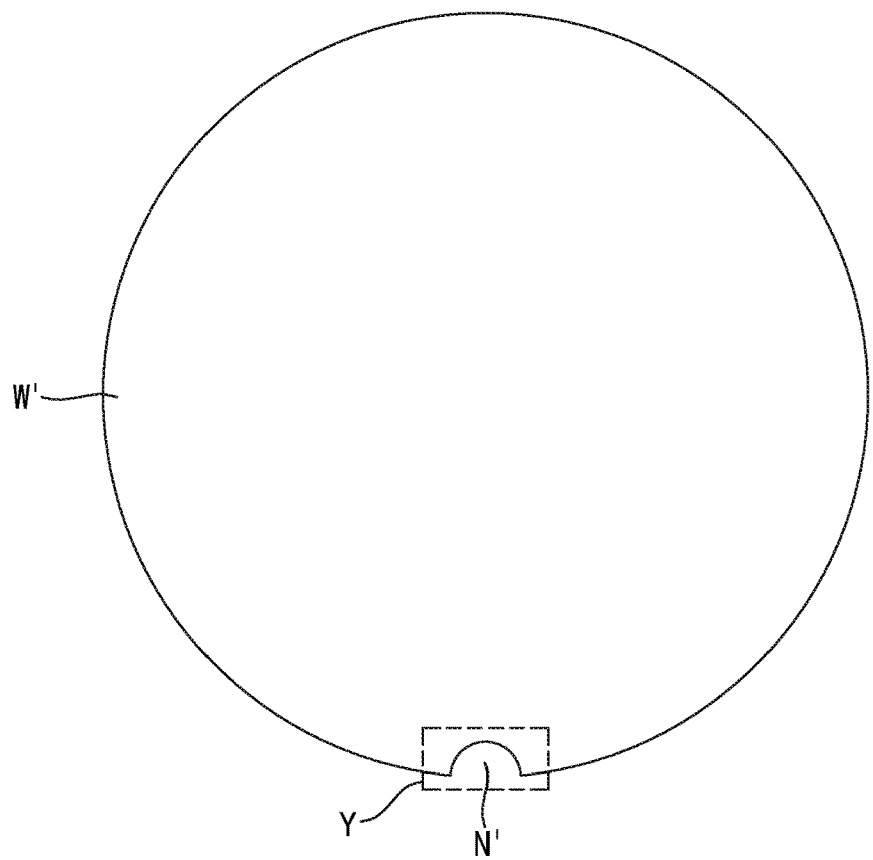

In an embodiment, the depth of the notch trim NT may be equal to the height of the target wafer W such that the notch trim NT may be invisible when viewed in a top view. Referring to FIG. 10, in an embodiment, the depth of the etch trim ET may also be equal to the height of the target wafer W such that the edge trim ET may be invisible when viewed in a top view. After the trimming process or after both the trimming process and a back-grinding process, the resultant wafer W' may have a smaller diameter than the target wafer W of FIG. 7 before the trimming process, and the resultant notch N' may have a greater width than the notch N of FIG. 7 before the trimming process.

Figure 11:
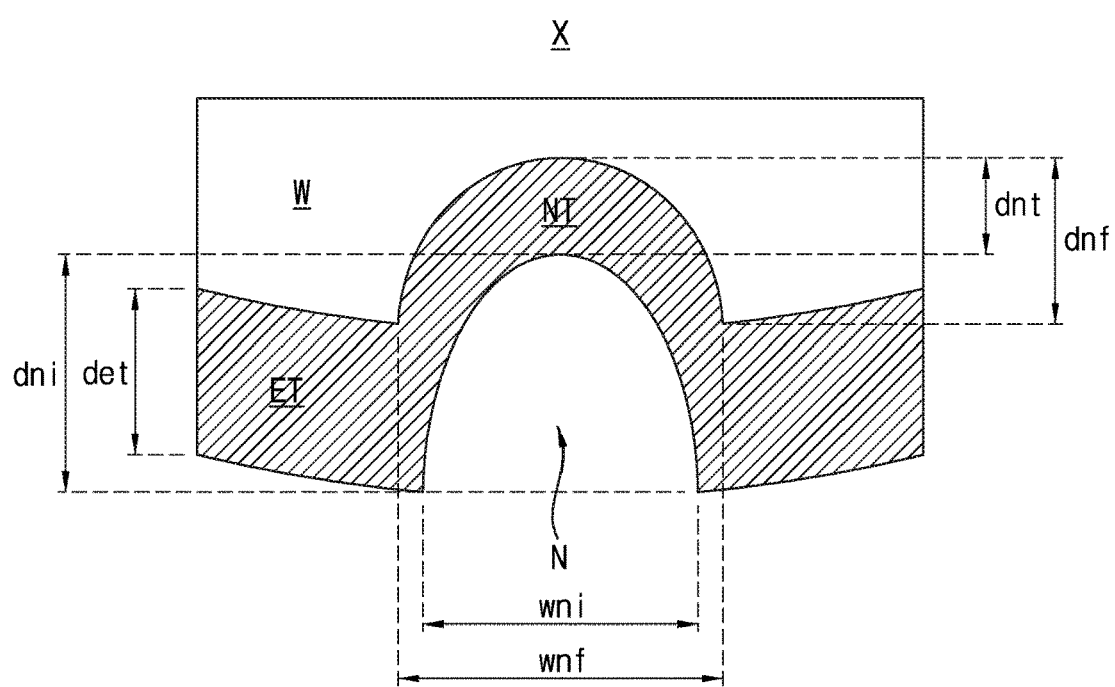
FIG. 11 is an enlarged view of a notch area X around the notch N in the wafer W trimmed using each of the wafer trimming devices 1, 2, and 3 according to respective exemplary embodiments of the present disclosure.

FIG. 11 is an enlarged view of a notch area X around the notch N in the wafer W trimmed using each of the wafer trimming devices 1, 2, and 3 according to respective exemplary embodiments of the present disclosure. For example, when a 12-inch wafer is used, the notch N may have an initial width wni of about 3 mm and an initial width dni of about 0.75 to 1.25 mm. After a back-grinding process, the radius of the wafer may be reduced by a width det of the edge trim ET. Accordingly, when it is necessary to leave the notch N even after the back-grinding process, the sum of the initial width dni of the notch N and the width dnt of the notch trim NT should be greater than the width det of the edge trim ET.

In an embodiment, the width det of the edge trim ET may be 3 mm or less in order to prevent the edge trim ET from reducing the good die (GD) area of the wafer. In addition, the width det of the edge trim ET should be greater than the width of a bevel (B) area. For example, when the width of the bevel (B) area in the target wafer W is 380 μm, the width det of the edge trim ET may be greater than 380 μm. Preferably, the width det of the edge trim ET is 3 times the width of the bevel (B) area. In this case, it may be possible to completely remove the bevel (B) area without reducing the GD area.

Referring to FIG. 11, the notch N is trimmed over a width not less than the initial width wni and, as such, the notch trim NT may have a final width wnf greater than the initial width wni. In addition, the final width dnf of the notch N may have a value obtained by deducting the width det of the edge trim ET from the sum of the initial width dni of the notch N and the width dnt of the notch trim NT. The width dnt of the notch trim NT should be greater than the width of the bevel (B) area.

Figure 12:
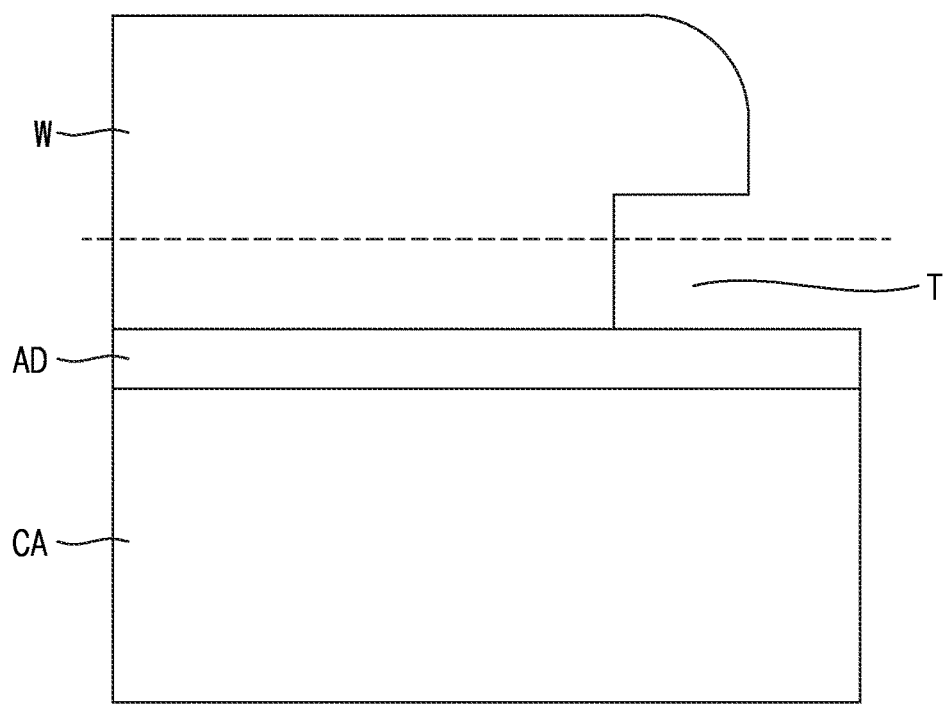
FIG. 12 is a view illustrating a state in which the wafer W trimmed in accordance with one exemplary embodiment of the present disclosure is bonded to a carrier wafer CA by an adhesive layer AD, for back-grinding.
Figure 13:
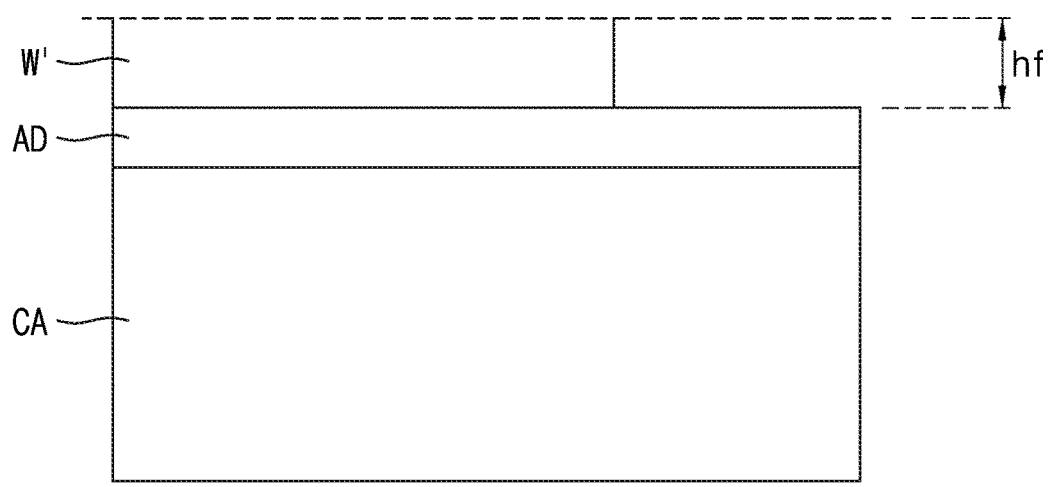
FIG. 13 is a view illustrating a state in which the wafer W trimmed in accordance with an exemplary embodiment of the present disclosure is subjected to back-grinding.

FIG. 12 is a view illustrating a state in which the wafer W trimmed in accordance with one exemplary embodiment of the present disclosure is bonded to a carrier wafer CA by an adhesive layer AD, for back-grinding. FIG. 13 is a view illustrating a state in which the wafer W trimmed in accordance with an exemplary embodiment of the present disclosure is subjected to back-grinding. Referring to FIGS. 12 and 13, the height of the trim T is greater than the thickness hf of the final semiconductor wafer W. For example, the thickness of a 12-inch wafer is about 775 μm, and the thickness of a final target semiconductor chip after a back-grinding process may be 200 to 600 μm. In an embodiment, the height of the trim T may be 600 μm or less. That is, in an embodiment of the present disclosure, the notch trimmer 20 may perform trimming such that the notch trim NT of the target wafer W has a height of 600 μm or less, and the edge trimmers 30 and 35 may perform trimming such that the edge trim ET of the target wafer has a height of 600 μm or less. The height of the edge trim ET and the height of the notch trim NT may differ from each other. In an embodiment, the height of the trim T may be greater than the thickness of the final semiconductor chip by 100 to 200 μm.

Figure 14:
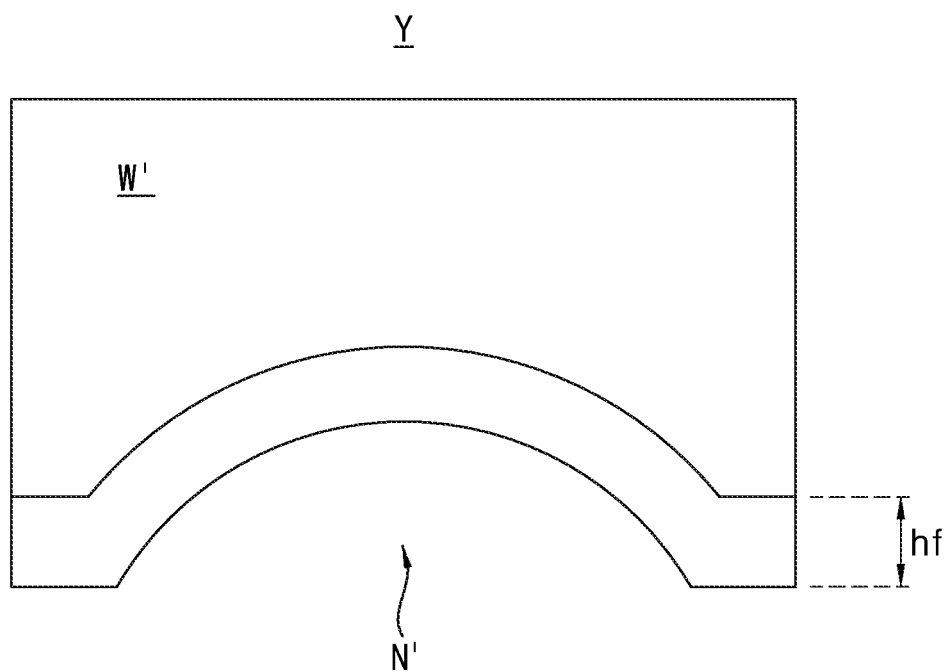
FIG. 14 is an enlarged view of a notch (N) area Y after back-grinding of the wafer W trimmed in accordance with an exemplary embodiment of the present disclosure.

FIG. 14 is an enlarged view of a notch (N) area Y after back-grinding of the wafer W trimmed in accordance with an exemplary embodiment of the present disclosure. Referring to FIG. 14, the notch (N) area Y after the back-grinding process may have an inner surface in the form of a vertical round surface having a predetermined height hf. In accordance with respective exemplary embodiments of the present disclosure, each of the wafer trimming devices 1, 2, and 3 may separately trim the edge E and the notch N such that trimming cross-sections of the edge (E) and notch (N) areas in the wafer W are vertical, thereby removing the bevel (B) area. Accordingly, it may be possible to prevent formation of a crack during the back-grinding process. The trimming width may also be minimized and, as such, it may be possible to prevent a reduction in good die (GD) area.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. A wafer trimming device comprising:
a chuck table configured to hold a target wafer via suction, thereby fixing the target wafer;
a notch trimmer configured to trim a notch of the target wafer; and
an edge trimmer configured to trim an edge of the target wafer,
wherein the notch trimmer comprises a notch trimming blade configured to rotate about a first rotation axis, and
wherein the notch trimmer comprises a mode-changeable structure such that the notch trimmer can be movably oriented such that the first rotation axis is perpendicular to a circumferential surface of the target wafer or such that the first rotation axis is parallel to the circumferential surface of the target wafer, and
wherein the edge trimmer comprises an edge trimming blade configured to rotate about a second rotation axis parallel to the circumferential surface of the target wafer.

2. The wafer trimming device according to claim 1, wherein the notch trimmer is configured to trim the notch in a direction perpendicular to the circumferential surface of the target wafer when the first rotation axis is perpendicular to the circumferential surface of the target wafer.

3. The wafer trimming device according to claim 1, wherein the notch trimmer is configured to trim the notch in a direction parallel to the circumferential surface of the target wafer when the first rotation axis is parallel to the circumferential surface of the target wafer.

4. The wafer trimming device according to claim 3, wherein a lowermost surface of the notch trimming blade is co-planar with an uppermost surface of the chuck table.

5. The wafer trimming device according to claim 1, wherein:
the notch trimming blade has a diameter of 3 mm or less; and
the notch trimmer is configured to perform trimming such that a notch trim of the target wafer has a height of 600 μm or less.

6. The wafer trimming device according to claim 1, wherein the edge trimmer is configured to trim the edge in a direction perpendicular to the circumferential surface of the target wafer.

7. The wafer trimming device according to claim 1, wherein the edge trimmer is configured to trim the edge in a direction parallel to the circumferential surface of the target wafer.

8. The wafer trimming device according to claim 7, wherein the edge trimming blade has a diameter greater than a height of the target wafer.

9. The wafer trimming device according to claim 1, wherein the edge trimmer is configured to perform trimming such that an edge trim of the target wafer has a width of 2 mm or less and a height of 600 μm or less.

10. A wafer trimming device comprising:
a chuck table configured to hold a target wafer via suction, thereby fixing the target wafer; and
a bar-shaped trimmer configured to trim a notch and an edge of the target wafer,
wherein the trimmer comprises a central shaft, and a trimming blade configured to rotate about the central shaft.

11. The wafer trimming device according to claim 10, wherein:
the trimming blade has a diameter of 3 mm or less; and
the trimmer is configured to perform trimming such that a notch trim of the target wafer has a height of 600 μm or less; and
the trimmer is configured to perform trimming such that an edge trim of the target wafer has a width of 2 mm or less and a height of 600 μm or less.

12. The wafer trimming device according to claim 10, wherein:
the trimmer is configured to trim the notch in a state in which the central shaft is vertically aligned with a circumferential surface of the target wafer; and
the trimmer is configured to trim the edge in a state in which the central shaft is parallel to the circumferential surface of the target wafer.

13. The wafer trimming device according to claim 12, wherein:

the trimmer is configured to trim the notch in a direction perpendicular to the circumferential surface of the target wafer; and the trimmer is configured to trim the edge in the direction perpendicular to the circumferential surface of the target wafer.

14. The wafer trimming device according to claim 12, wherein:

the trimmer is configured to trim the notch in a direction parallel to the circumferential surface of the target wafer; and the trimmer is configured to trim the edge in a direction perpendicular to the circumferential surface of the target wafer.

15. The wafer trimming device according to claim 12, wherein:

the trimmer is configured to trim the notch in a direction perpendicular to the circumferential surface of the target wafer; and the trimmer is configured to trim the edge in a direction parallel to the circumferential surface of the target wafer.

16. The wafer trimming device according to claim 12, wherein:

the trimmer is configured to trim the notch in a direction parallel to the circumferential surface of the target wafer; and the trimmer is configured to trim the edge in the direction parallel to the circumferential surface of the target wafer.

17. The wafer trimming device according to claim 12, wherein the trimmer is configured to trim the edge while rotating in a direction parallel to the target wafer.

18. The wafer trimming device according to claim 10, wherein the trimmer is configured to trim the notch and the edge in a state in which the central shaft is vertically aligned with a circumferential surface of the target wafer.

19. A wafer trimming device comprising:

a chuck table configured to hold a target wafer via suction, thereby fixing the target wafer;

a notch trimmer configured to trim a notch of the target wafer; and an edge trimmer configured to trim an edge of the target wafer, wherein the notch trimmer comprises a notch trimming blade configured to rotate about a rotation axis perpendicular to a circumferential surface of the target wafer, and wherein the edge trimmer comprises an edge trimming blade configured to rotate about a rotation axis parallel to the circumferential surface of the target wafer, and wherein the edge trimmer is configured to perform trimming such that an edge trim of the target wafer has a width of 2 mm or less and a height of 600 μm or less.

20. The wafer trimming device according to claim 19, wherein:

the notch trimming blade has a diameter of 3 mm or less; and the notch trimmer is configured to perform trimming such that a notch trim of the target wafer has a height of 600 μm or less.

* * * * *